(12) United States Patent
Edmond

(10) Patent No.: US 8,524,515 B2
(45) Date of Patent: Sep. 3, 2013

(54) SEMICONDUCTOR LIGHT EMITTING DIODES INCLUDING MULTIPLE BOND PADS ON A SINGLE SEMICONDUCTOR DIE

(75) Inventor: John Adam Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 42 days.

(21) Appl. No.: 12/938,877

(22) Filed: Nov. 3, 2010

(65) Prior Publication Data

US 2011/0042705 A1 Feb. 24, 2011

Related U.S. Application Data

(63) Continuation of application No. 12/199,592, filed on Aug. 27, 2008, now Pat. No. 7,843,060, which is a continuation-in-part of application No. 29/280,949, filed on Jun. 11, 2007, now Pat. No. Des. 582,865.

(51) Int. Cl.
*H01L 21/00* (2006.01)

(52) U.S. Cl.
USPC .......................................................... 438/27

(58) Field of Classification Search
USPC .......................................................... 438/27
See application file for complete search history.

(56) References Cited

U.S. PATENT DOCUMENTS

| | | | |
|---|---|---|---|
| 6,097,040 A | 8/2000 | Morimoto et al. | |
| 6,255,129 B1 | 7/2001 | Lin | |
| 6,383,835 B1 | 5/2002 | Hata et al. | |
| 6,498,592 B1 | 12/2002 | Matthies | |
| 6,518,598 B1 | 2/2003 | Chen | |
| 6,713,868 B2 | 3/2004 | Ueno | |
| 6,734,623 B1 | 5/2004 | Aziz et al. | |
| 6,847,052 B2 | 1/2005 | Fan et al. | |
| 6,870,519 B2 | 3/2005 | Sundahl | |
| 6,958,498 B2 * | 10/2005 | Shelton et al. | 257/99 |
| 7,271,426 B2 | 9/2007 | Horio et al. | |
| 7,289,089 B2 | 10/2007 | Iwafuchi | |
| D566,056 S | 4/2008 | Edmond et al. | |
| D566,057 S | 4/2008 | Edmond et al. | |
| D566,665 S | 4/2008 | Liao et al. | |
| 2002/0054266 A1 * | 5/2002 | Nishimura | 349/149 |
| 2003/0222263 A1 | 12/2003 | Choi | |
| 2005/0023539 A1 | 2/2005 | Fujiwara et al. | |
| 2005/0067624 A1 | 3/2005 | Steigerwald et al. | |
| 2005/0077623 A1 | 4/2005 | Roberts et al. | |
| 2006/0049422 A1 | 3/2006 | Shoji | |
| 2006/0131600 A1 | 6/2006 | Nakaoka et al. | |
| 2006/0151800 A1 | 7/2006 | Keong et al. | |

(Continued)

OTHER PUBLICATIONS

An answer to LED droop?, downloaded Aug. 6, 2008 from compoundsemiconductor.net/cws/article/lab/32412, 7 pp.

(Continued)

*Primary Examiner* — Charles Garber
*Assistant Examiner* — Andre' C Stevenson
(74) *Attorney, Agent, or Firm* — Myers Bigel Sibley & Sajovec, P.A.

(57) ABSTRACT

A light emitting device includes a single semiconductor die light emitting diode and at least five bond pads on the single semiconductor die. The bond pads may be in the four corners and at least one midpoint of the single semiconductor die. A wavelength conversion layer may be provided and bond pad extensions may extend through the wavelength conversion layer. Multiple wire bond connections may also be provided.

23 Claims, 8 Drawing Sheets

(56) References Cited

U.S. PATENT DOCUMENTS

| | | | |
|---|---|---|---|
| 2006/0226437 A1 | 10/2006 | Fujita et al. | |
| 2007/0075323 A1 | 4/2007 | Kanazawa et al. | |
| 2007/0080361 A1* | 4/2007 | Malm | 257/99 |
| 2007/0085089 A1 | 4/2007 | Hsu | |
| 2007/0138585 A1 | 6/2007 | Hsin et al. | |
| 2007/0223219 A1 | 9/2007 | Medendorp, Jr. et al. | |
| 2008/0121921 A1* | 5/2008 | Loh et al. | 257/99 |
| 2008/0121924 A1* | 5/2008 | Miki et al. | 257/103 |
| 2008/0173884 A1 | 7/2008 | Chitnis et al. | |
| 2008/0179611 A1 | 7/2008 | Chitnis et al. | |
| 2008/0179618 A1* | 7/2008 | Cheng | 257/99 |

OTHER PUBLICATIONS

Color photos Lumileds LEDs, 1 page, (for exam purposes, date is assumed to be before Dec. 21, 2006).

Cree, Inc., Press Release "Cree Achieves 1,000 Lumens from a Single LED", downloaded Jan. 17, 2008 from www.cree.com/press/press_detail.asp?i=1189169857943, 2 pp.

Cree, Inc., Data Sheet CPR3CR, Rev. A, *Cree® EZ1000™ LEDs Data Sheet CxxxEZ1000-Sxx000*, 2006, 6 pp.

Edmond et al. design U.S. Appl. No. 29/280,949, filed Jun. 11, 2007.

Edmond et al., design U.S. Appl. No. 29/284,431, filed Sep. 7, 2007.

Image of Osram chip, 1 page, (prior to Dec. 29, 2005).

"Lumileds LED," 1 page, (Oct. 2-4, 2002).

Lumileds LED Die; Philips/Lumileds Light from Silicon Valley "LED Die," pp. 1-2, <http://www.lumileds.com/products/line.cm?lineId=16> (2006).

Osram GmbH, "Technical Press: High-current single-chip LEDs up to 2 A", Nov. 22, 2007, 2 pp.

SemiLEDS "Products", 2 pages, http://www.semileds.com/en_04product.asp (2006).

* cited by examiner

SEMICONDUCTOR LIGHT EMITTING DIODES INCLUDING MULTIPLE BOND PADS ON A SINGLE SEMICONDUCTOR DIE

CROSS-REFERENCE TO RELATED APPLICATIONS

The present application is a continuation of U.S. patent application Ser. No. 12/199,592, filed Aug. 27, 2008 now U.S. Pat. No. 7,843,060, entitled Droop-Free High Output Light Emitting Devices and Methods of Fabricating and Operating Same, which itself is a continuation-in-part of application Ser. No. 29/280,949, filed Jun. 11, 2007 now U.S. Pat. No. D,582,865, entitled LED Chip, assigned to the assignee of the present application, the disclosure of which is hereby incorporated herein by reference in its entirety as if set forth fully herein.

FIELD OF THE INVENTION

This invention relates to semiconductor light emitting devices and methods of fabricating and operating same, and more particularly, to high output semiconductor light emitting devices and methods of fabricating and operating same.

BACKGROUND OF THE INVENTION

Semiconductor light emitting devices ("LEDs"), such as light emitting diodes and laser diodes are widely known solid-state lighting elements that are capable of generating light upon application of voltage thereto. Light emitting devices generally include a p-n junction, an anode ohmic contact for the p-type region of the device, and a cathode ohmic contact for the n-type region of the device. The device may be formed on a substrate, such as a sapphire, silicon, silicon carbide, gallium arsenide, gallium nitride, etc., substrate, or the device may not include a substrate.

LEDs are increasingly being used in lighting/illumination applications, with an ultimate goal being a replacement for the ubiquitous incandescent light bulb. As is well known to those having skill in the art, an incandescent light bulb generally produces "warm white light", i.e., light with a Correlated Color Temperature (CCT) of between about 2,600 K and about 6,000 K. In order to produce white light, multiple LEDs emitting light of different colors and/or one or more single color LEDs that include a wavelength conversion material such as phosphor thereon, may be used.

In efforts to increase the total light output of an LED, researchers and manufacturers have continued to apply increasing current density to the LED. Unfortunately, a major obstacle to increasing the current density in the LED is so-called "droop", i.e., the falloff in quantum efficiency at relatively high drive currents.

FIG. 1 illustrates the droop phenomena by graphically illustrating current density vs. quantum efficiency (for example in lumens per watt or as a %) for a conventional LED. As shown in FIG. 1, at relatively low current densities, a linear increase in quantum efficiency is attained. However, at increasing current densities, a decrease in quantum efficiency from the linear quantum efficiency shown by the dashed line of FIG. 1 takes place, as shown by the right pointing arrow in FIG. 1. The decrease in quantum efficiency indicated by the cross-hatched area between the solid line of actual quantum efficiency and the dashed line of the linear quantum efficiency, is referred to as "droop". Notwithstanding this droop, researchers and manufacturers of LEDs have continued to develop LEDs that can sustain increased current density in an attempt to maximize the light output of the device.

SUMMARY OF THE INVENTION

Light emitting devices according to some embodiments of the present invention include a semiconductor light emitting diode that is configured to operate at a substantially droop-free quantum efficiency while producing warm white light output of at least about 100 lumens/cool white light output of at least about 130 lumens. As used herein, substantially droop-free quantum efficiency has less than about 5% deviation from linearity of quantum efficiency. In other embodiments, the semiconductor light emitting diode comprises a single semiconductor die of at least about 4 mm$^2$ in area that operates at a current density of less than about 9 A/cm$^2$, so as to operate at the substantially droop-free quantum efficiency. In yet other embodiments, the single semiconductor die is configured to operate at an input voltage of about 3V and an input current of about 350 mA.

In still other embodiments, the single semiconductor die is a single square semiconductor die that includes four sides, each of which includes a midpoint and which define four corners. The light emitting device further includes a plurality of bond pads, a respective one of which is located at a respective midpoint and at a respective corner of the single square semiconductor die. In other embodiments, at least five bond pads may be provided on the single square semiconductor die. Moreover, at least five spaced apart cathode contact lines may be provided on the single semiconductor die, extending parallel to a first opposing pair of the four sides, and at least five spaced apart cathode contact lines may be provided on the single semiconductor die, extending parallel to a second opposing pair of the four sides. The cathode contact lines are electrically connected to the bond pads.

A plurality of wire bond connections also may be provided that are connected to a subset (less than all) of the plurality of bond pads, in some embodiments. In other embodiments, a wire bond connection is provided for each of the plurality of bond pads.

Light emitting devices that can produce at least about 100 lumens of warm white light/at least about 130 lumens of cool white light may be fabricated according to various embodiments of the present invention, by increasing a die size of a semiconductor light emitting diode to at least 4 mm$^2$, so as to reduce operating current density in the semiconductor light emitting diode to less than about 9 A/cm$^2$ and operate the semiconductor light emitting diode at a substantially droop-free quantum efficiency. Any of the above-described embodiments may be used in these methods of fabricating a light emitting devices.

Other embodiments of the invention provide methods of operating a light emitting device to produce at least about 100 lumens of warm white light/at least about 130 lumens of cool white light by reducing operating current density in a semiconductor light emitting diode having a die size of at least about 4 mm$^2$ to less than about 9 A/cm$^2$, so as to operate the semiconductor light emitting diode at a substantially droop-free quantum efficiency. These methods of operating a light emitting device may be used in conjunction with any of the above-described embodiments.

DETAILED DESCRIPTION

Figure 1:
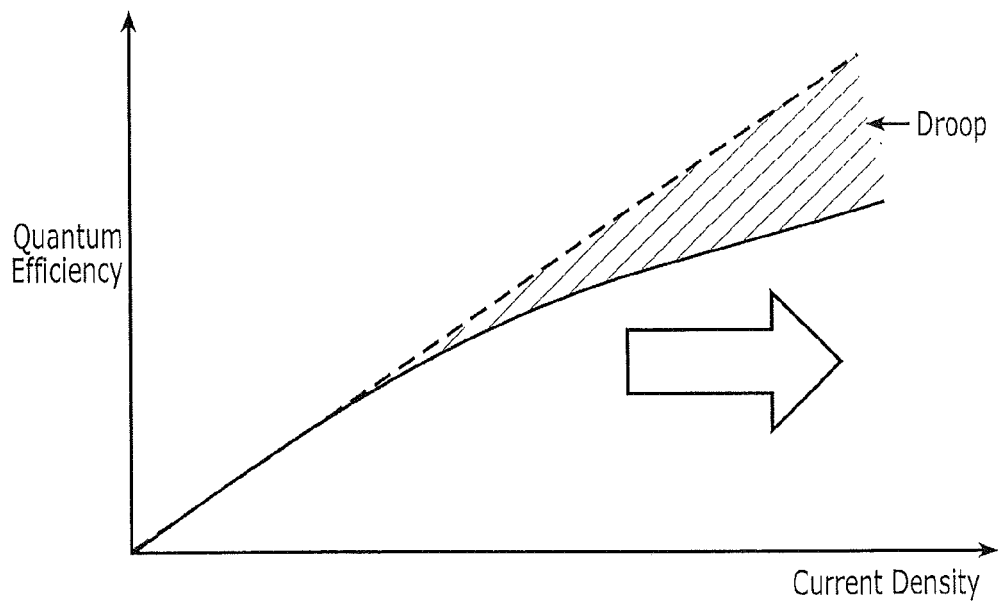
FIG. 1 graphically illustrates quantum efficiency of prior art light emitting devices.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
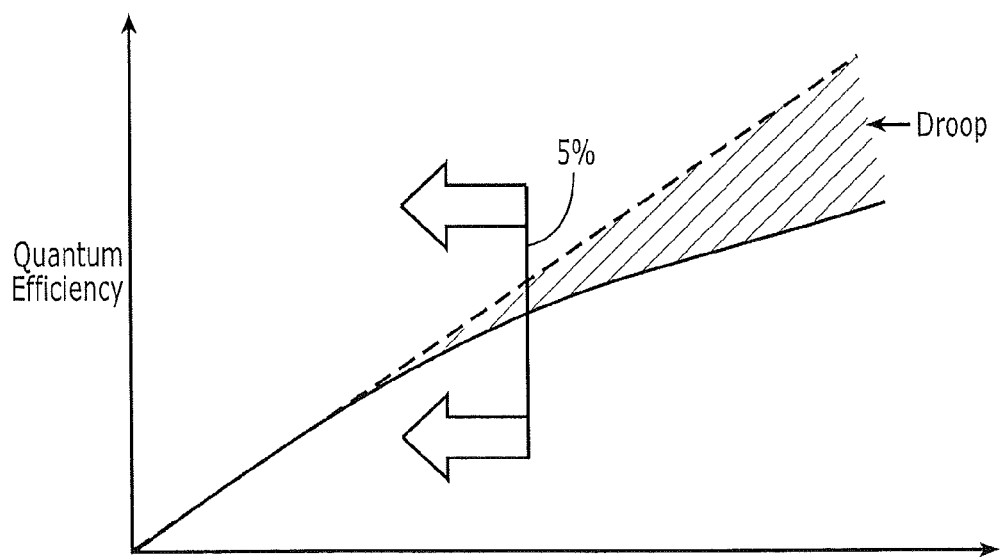
FIG. 2 graphically illustrates quantum efficiency of light emitting devices according to various embodiments of the present invention.

Some embodiments of the present invention arise from a reversal of the clear trend of increasing current density into an LED, to thereby increase the light output thereof, as was depicted in FIG. 1. Rather, as shown in FIG. 2, according to various embodiments of the invention, current density is actually decreased, as shown by the left pointing arrows of FIG. 2, to operate the semiconductor light emitting diode at a substantially droop-free quantum efficiency, i.e., a quantum efficiency that has less than about 5% deviation from linearity of quantum efficiency. Accordingly, light emitting devices according to various embodiments of the present invention may have a droop of less than about 5%, whereas conventional semiconductor light emitting diodes may have a droop of 10%, 15% or more, in order to attain a desired light output.

In order to attain the desired light output, such as warm white light output of at least about 100 lumens/cool white light output of at least about 130 lumens, while maintaining a substantially droop-free quantum efficiency, some embodiments of the present invention may substantially increase the size of the single semiconductor die of the semiconductor light emitting diode. In some embodiments, a single semiconductor die of at least about 4 mm$^2$ operates at a current density of less than about 9 A/cm$^2$, so as to operate at a substantially droop-free quantum efficiency. The single semiconductor die may be configured at an input voltage of about 3 V and an input current of about 350 mA, so as to provide approximately one watt input power.

Figure 3:
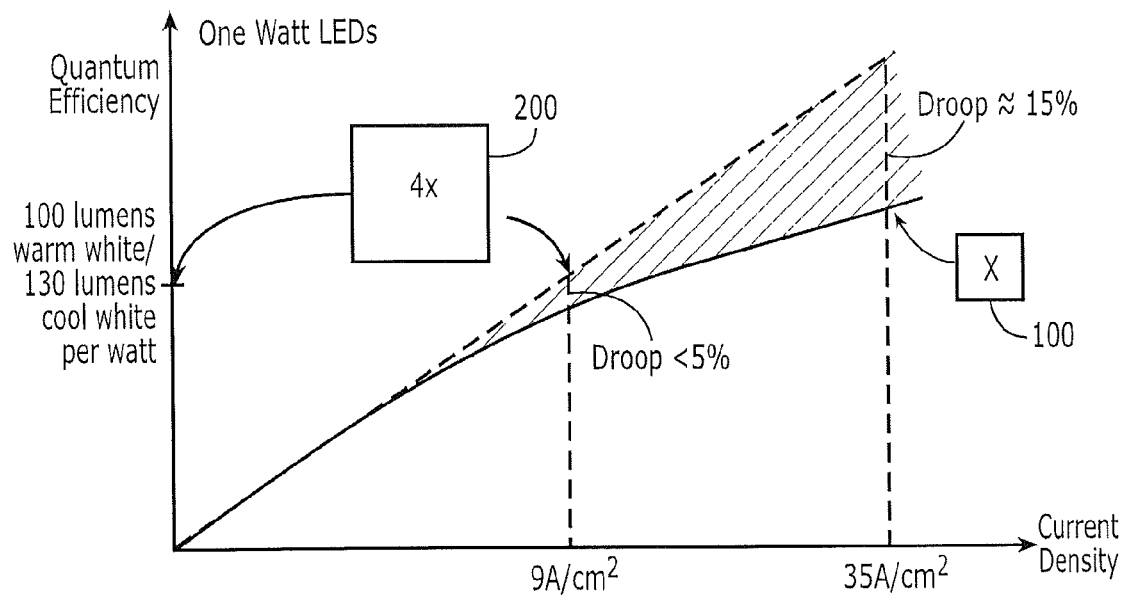
FIG. 3 graphically illustrates quantum efficiency of 1 watt conventional LEDs and 1 watt LEDs according to various embodiments of the present invention.

This contrast is graphically illustrated in FIG. 3, which graphically illustrates quantum efficiency vs. current density for two LEDs 100 and 200. LED 100 may be represented by a commercially available LED, such as a Cree® EZ1000™ LED, manufactured by the assignee of the present invention, and described in the Data Sheet CPR3CR, Rev. A, entitled Cree® EZ1000™ LEDs Data Sheet CxxxEZ1000-Sxx000, copyright 2006, Cree, Inc., available on the Web at cree.com. As indicated in this data sheet, these LEDs may use a single semiconductor die of size 980/980 μm$^2$ or about 1 mm$^2$. These LEDs may operate at a voltage of about 3 V (more typically about 3.3 V), and a current of about 350 mA (current density of about 35 A/cm$^2$) for an input power of about 1 watt. A droop of about 15% from linearity is provided. The Cree EZ1000 LED may be manufactured under one or more of the following U.S. patents/applications, the disclosures of which are hereby incorporated herein in their entirety as if set forth fully herein: U.S. Pat. No. D566,057, issued Apr. 8, 2008, entitled LED Chip; U.S. Application Publication No. 2008/0173884, published Jul. 24, 2008, entitled Wafer Level Phosphor Coating Method and Devices Fabricated Utilizing Same; U.S. Application Publication No. 2008/0179611, published Jul. 31, 2008, entitled Wafer Level Phosphor Coating Method and Devices Fabricated Utilizing Same; and U.S. Application No. 29/284,431, filed Sep. 7, 2007, entitled LED Chip.

In sharp contrast, as also shown in FIG. 3, light emitting devices 200 according to some embodiments of the present invention may operate at about ¼ the current density or about 9 A/cm$^2$, to produce a droop that is less than about 5%. An input voltage of about 3 V (e.g., between about 2.9 V and about 3.5 V and typically about 3.3 V) and an input current of about 350 mA may be used, so that a 1 watt LED is also provided, similar to LED 100. However, in order to produce about the same light output as LED 100, i.e., about 100 lumens of warm white light/about 130 lumens of cool white light, the area of LEDs 200 may be increased by about four times (4×) that of LEDs 100. Thus, current density may be reduced by about ¼ to about 9 A/cm$^2$, so that a substantially droop-free quantum efficiency may be provided, while increasing the die area by about four times, to about 4 mm$^2$, to provide at least about 100 lumens of warm white light/at least about 130 lumens of cool white light.

Thus, LEDs 200 according to some embodiments of the present invention may be manufactured by increasing a die size of a semiconductor light emitting diode to at least 4 mm$^2$, so as to reduce operating current density in the semiconductor light emitting diode to less that about 9 A/cm$^2$ and operate the semiconductor light emitting diode at a substantially droop-free quantum efficiency, as shown in FIG. 3. The LED may be operated to produce at least about 100 lumens of warm white light/at least about 130 lumens of cool white light, by reducing operating current density in a semiconductor light emitting diodes having a die size of at least about 4 mm$^2$ to less than about 9 A/cm$^2$, so as to operate the semiconductor light emitting diode at a substantially droop-free quantum efficiency, as also shown in FIG. 3.

Figure 4:
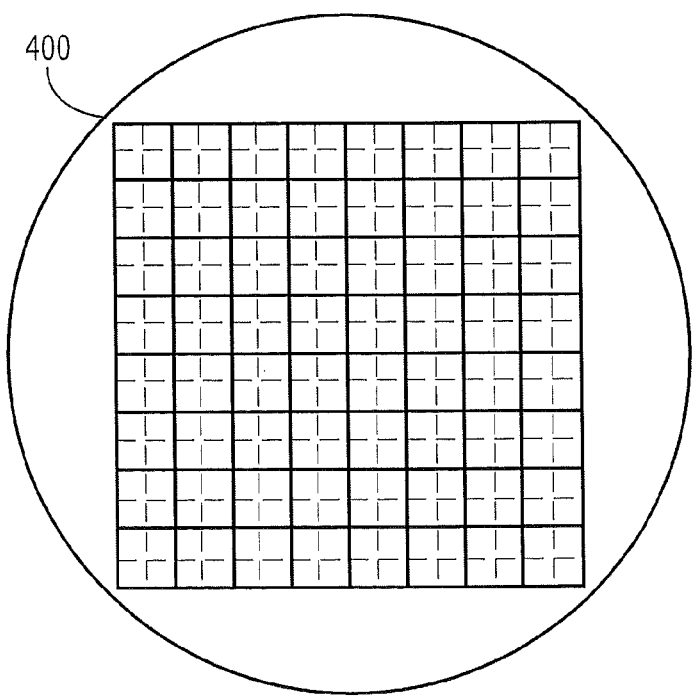
FIG. 4 illustrates methods of fabricating light emitting devices according to various embodiments of the present invention.

As illustrated in FIG. 4, some embodiments of the present invention may be fabricated by fabricating wafers 400 that are used to fabricate high brightness LEDs, such as Cree EZ1000 LEDs. However, rather than dicing the wafer 400 along the solid and dashed lines of FIG. 4 to produce semiconductor dies of about 1 mm$^2$ in area, the semiconductor wafer 400 is only diced along the solid lines of FIG. 4, to produce ¼ the amount of dies, each of which is four times the size, or about 4 mm$^2$ in area. A different cathode contact structure may be employed, as will be described below. However, the semiconductor fabrication and packaging process may otherwise be the same as that used with other high brightness LEDs, such as Cree EZ1000 LEDs. It will also be understood that other high brightness LEDs, i.e., 1 watt or more input power LEDs, may be used.

Figure 5:
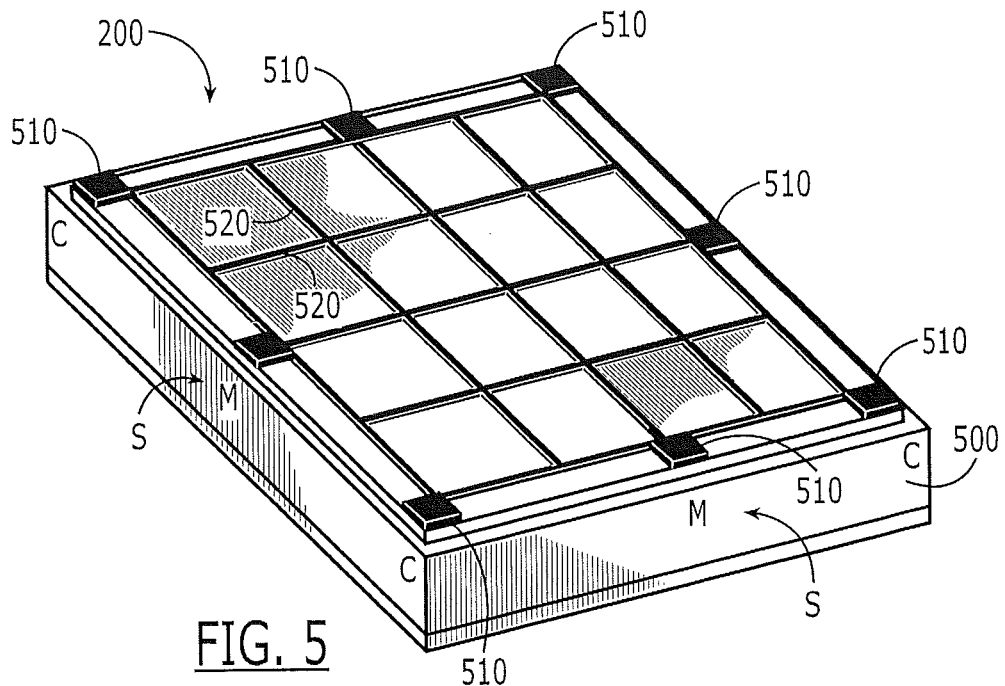
FIGS. 5-7 are perspective views of light emitting devices according to various embodiments of the present invention.

FIG. 5 is a perspective view of a light emitting device according to some embodiments of the present invention. As shown in FIG. 5, the light emitting device includes a semiconductor light emitting diode 500 that is configured to operate at a substantially droop-free quantum efficiency, while producing a warm white light output of at least about 100 lumens/a cool white light output of at least about 130 lumens. As shown, the semiconductor light emitting diode 500 comprises a single semiconductor die of about 4 mm$^2$ in area (i.e., about 2 mm on a side) that operates at a current density of less than about 9 A/cm$^2$, so as to operate at a substantially droop-free quantum efficiency. The single semiconductor die may be configured to operate at an input voltage of about 3 V and an input current of about 350 mA, and may have less than about 5% deviation from linearity of quantum efficiency. The semiconductor die includes a p-n junction and may include a substrate.

Still referring to FIG. 5, the single semiconductor die 500 is a single square semiconductor die that includes four sides S, each of which includes a midpoint M and which define four corners C (only two of which are illustrated in the perspective view of FIG. 5). The light emitting device 200 also includes a plurality of bond pads 510, a respective one of which is located at a respective midpoint M and at a respective corner C of the single square semiconductor die 500. Thus, eight bond pads 510 are shown. In other embodiments, up to three of these bond pads may be omitted, so that at least five bond pads 510 are provided. For example, three midpoint band pads may be omitted. Fewer than five bond pads may also be provided in other embodiments.

Still referring to FIG. 5, a plurality of spaced apart cathode contact lines 520 are also provided. In particular, at least five spaced apart cathode contact lines 520 are provided on the single semiconductor die 500 extending parallel to a first opposing pair of the four sides S and at least five spaced apart cathode contact lines are provided on the single semiconductor die 500 extending parallel to a second opposing pair of four sides S. Thus, a total of 10 cathode contact lines 520 may be provided along two orthogonal directions. The cathode contact lines 520 are electrically connected to the bond pads 510. The bond pads 510 and cathode contact lines 520 may be fabricated using techniques that are used to fabricate cathode contacts for a high output LED, such as a Cree EZ1000 LED.

Figure 6:
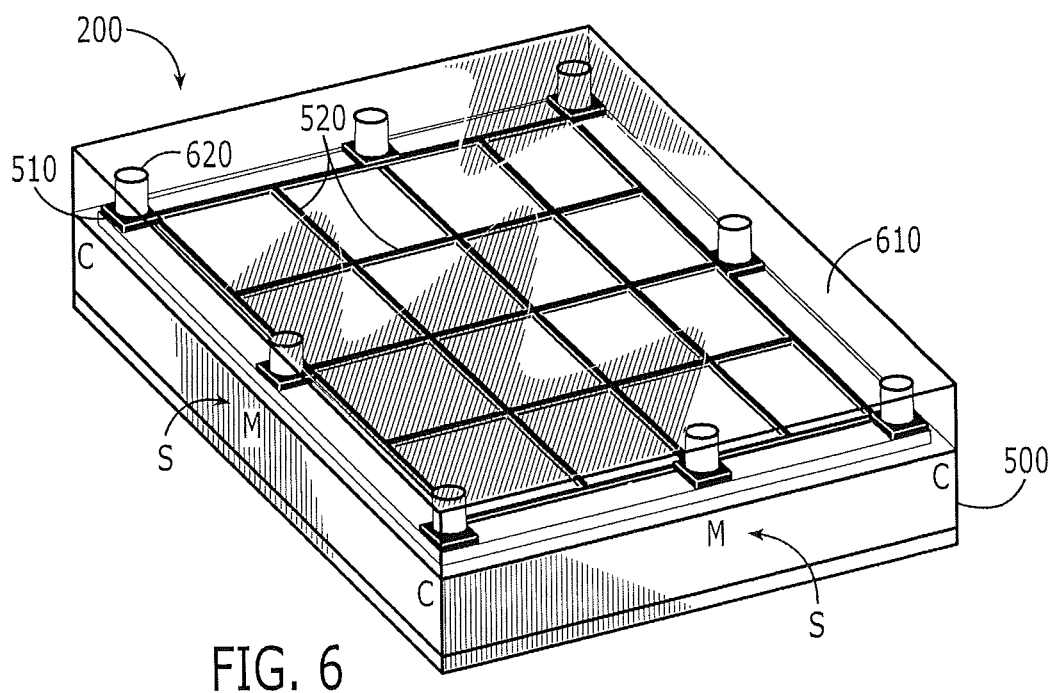

FIG. 6 illustrates other embodiments of the present invention, in which a wavelength conversion layer, such as a phosphor layer 610, is provided on the cathode surface of the semiconductor light emitting diode 500 using techniques that are well known. Bond pad extensions 620 may also be provided to facilitate wire bonding of the LED 200 that includes phosphor 610 thereon.

Figure 7:
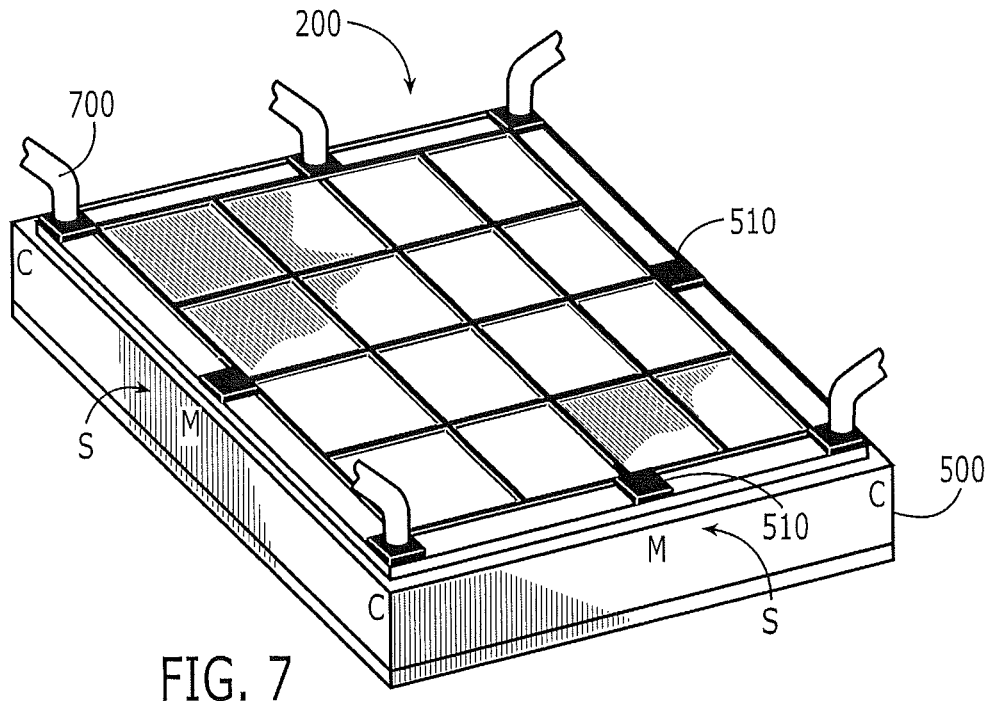

FIG. 7 is a perspective view of an LED 200 according to other embodiments of the present invention that includes a plurality of wire bond connections 700 that are electrically connected to the bond pads 510. In some embodiments, a subset (i.e., not all) of the bond pads 510 may have a wire bond connection in order to efficiently distribute current over the cathode. For example, as shown in FIG. 7, there are eight bond pads 510, but only five wire bond connections 700. In other embodiments, however, each bond pad 510 may include a wire bond connection 700. The wire bond connections 700 may be connected to a mounting substrate or other submount using known techniques. Fewer than five wire bond connections also may be used in other embodiments As was already described, light emitting devices according to various embodiments of the present invention can reduce or substantially eliminate droop, which may be has a major obstacle to solid-state lighting. Various embodiments of the invention may reverse the trend of applying increasing current density to a semiconductor light emitting diode. Moreover, embodiments of the present invention may produce other unexpected results. In particular, in order to obtain a given light output, such as, for example, at least about 100 lumens of warm white light/at least about 130 lumens of cool white light, multiple semiconductor light emitting diode dies conventionally may be used. However, there may be a limit on how close the multiple semiconductor dies may be mounted on a mounting substrate. The spacing between adjacent dies may cause visible variations in the intensity and/or color of the emitted light, which may be particularly visible in back reflecting applications. In sharp contrast, by using a single semiconductor die according to various embodiments of the present invention, a single point source may be provided, which can improve light/color uniformity in many applications. Moreover, by providing a single semiconductor die, packaging requirements may be greatly simplified compared to prior art approaches, which may need to package multiple dies in a closely spaced apart relationship.

Figure 8:
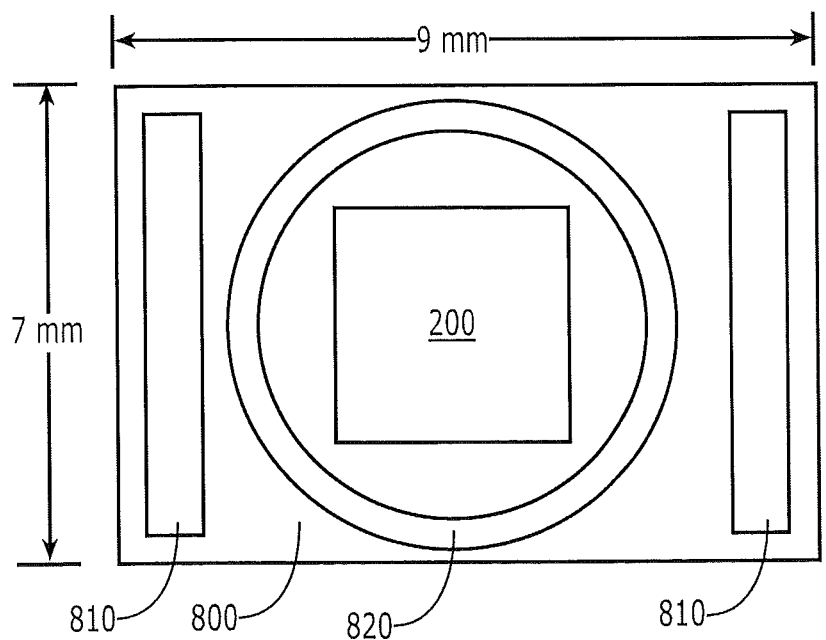
FIG. 8 is a plan view of a packaged light emitting device according to various embodiments of the present invention.

In other embodiments, a single die LED is mounted in an LED lamp package, where the overall lamp package has a small footprint, such as less than about 9 mm×7 mm. This can provide an LED lamp package with high lumen output per footprint. FIG. 8 is a top view of an embodiment of an LED package, including a semiconductor light emitting diode 200 according to various embodiments of the present invention, that is mounted on a submount 800 that includes internal cathode contacts 810 and an optical element, such as a lens 820. The anode contact may be formed on the bottom surface of the submount 800 (not shown).

Figure 9:
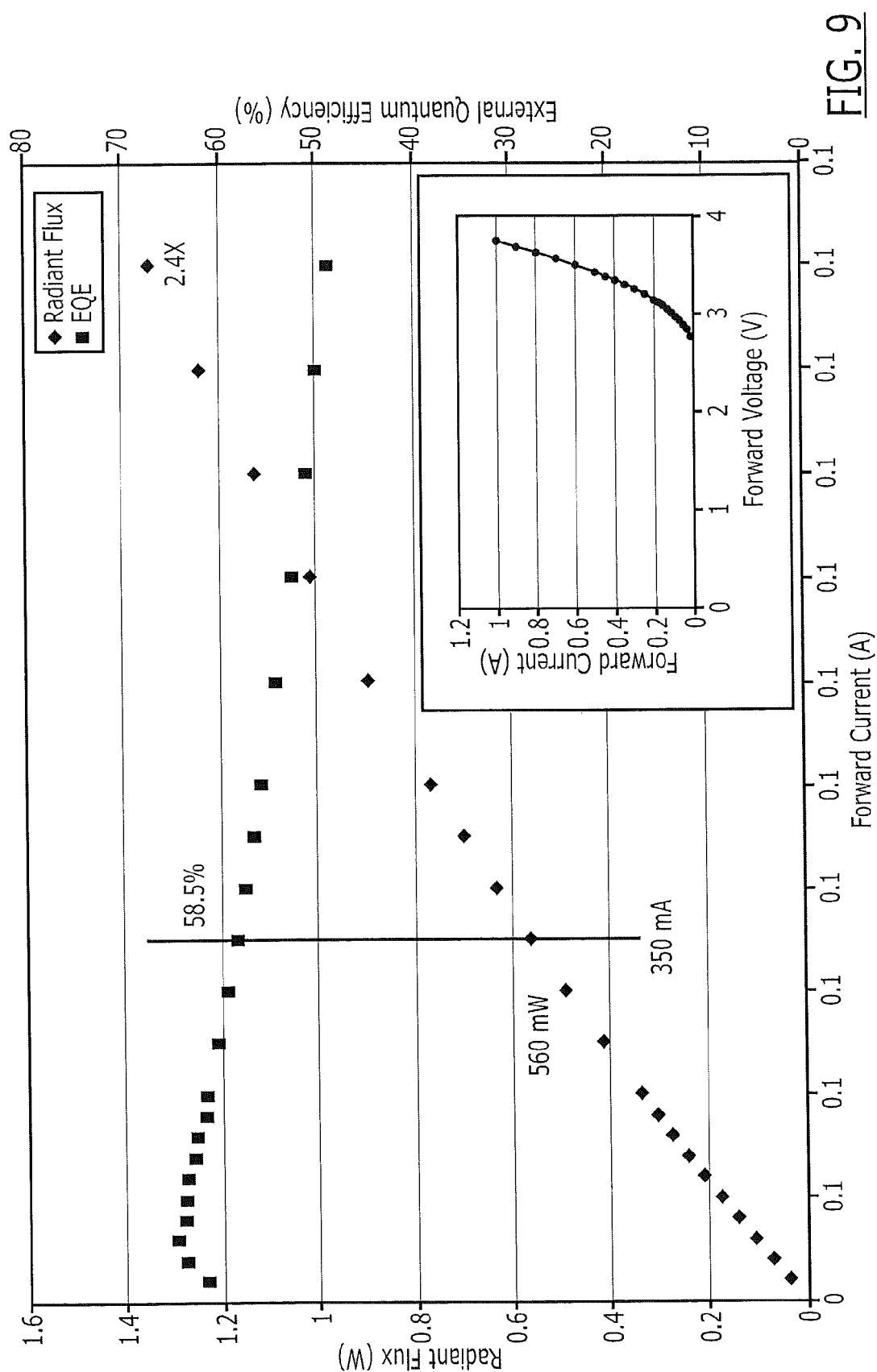
FIGS. 9 and 10 graphically illustrate quantum efficiency for prior art blue and white LEDs, respectively.
Figure 10:
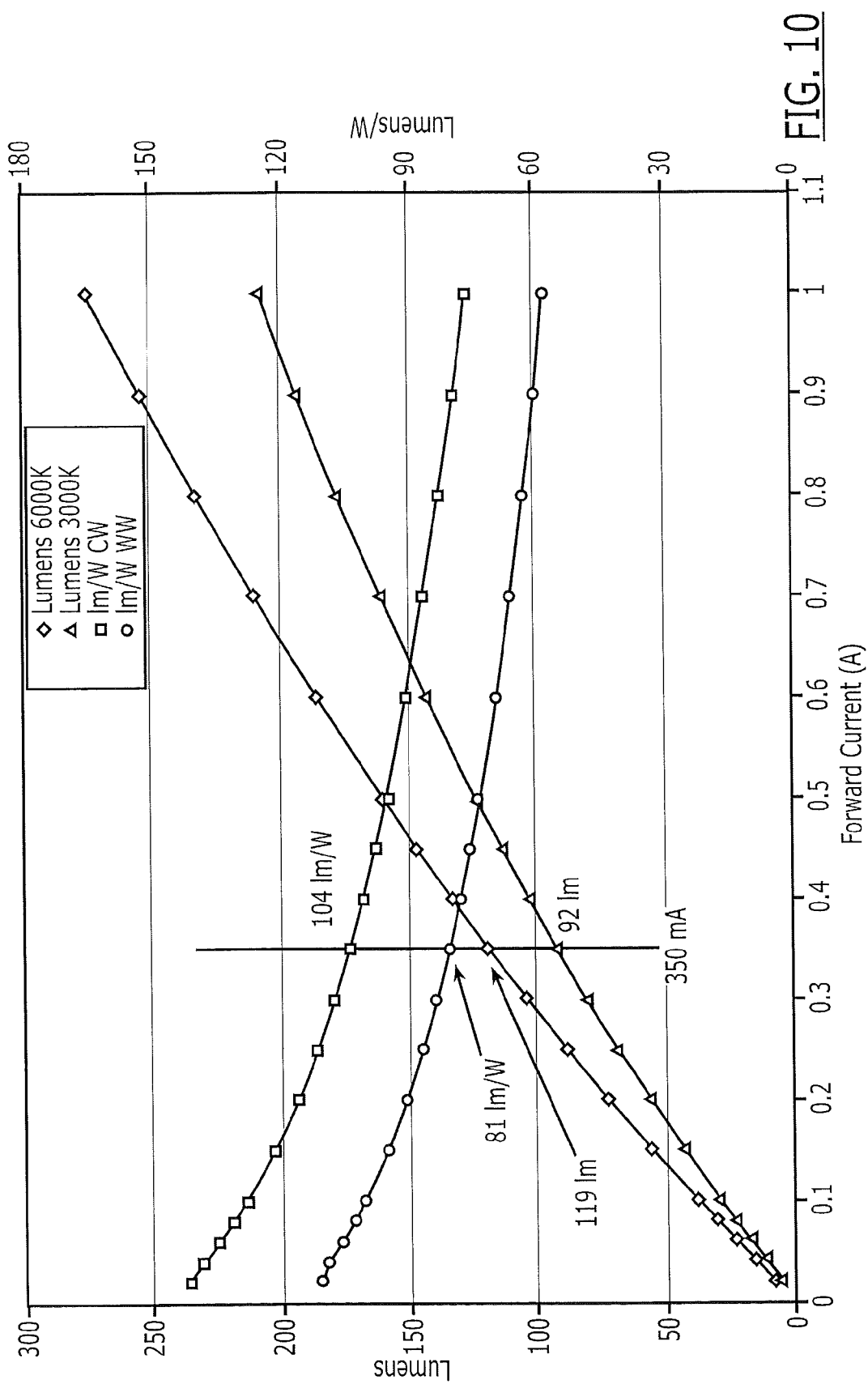

FIGS. 9 and 10 graphically illustrate performance characteristics for a prior art LED 100 of FIG. 3, which may be a Cree EZ1000 LED. FIG. 9 provides data for a blue LED, and illustrates a decrease in External Quantum Efficiency (EQE) at the operating voltage of 350 mA (corresponding to 560 mW). FIG. 10 illustrates similar data for a blue LED that includes a YAG phosphor thereon to produce cool white (CW) or warm white (WW) light. Again, note the large decreases in quantum efficiency at the operating current of 350 mA.

Figure 11:
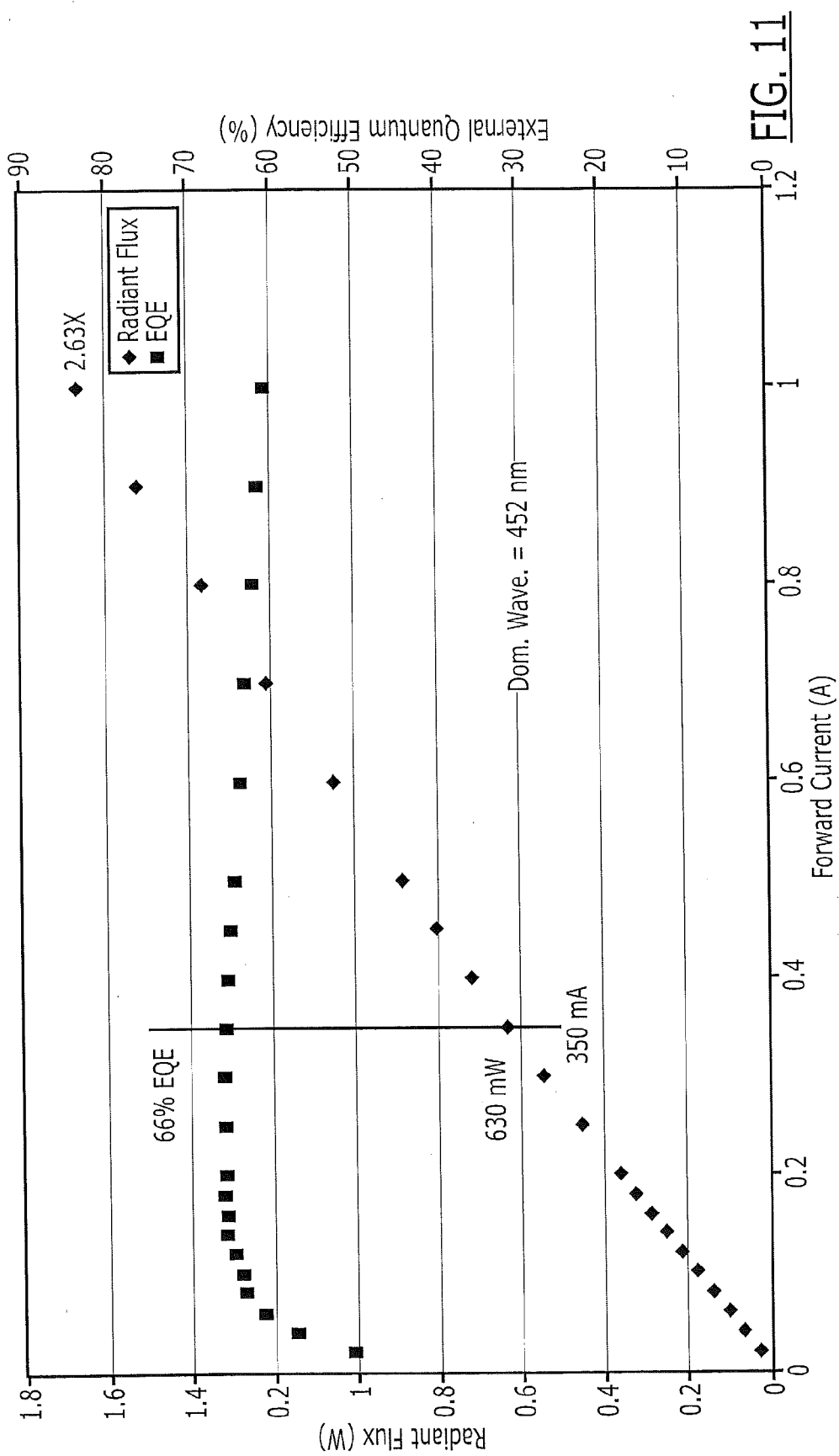
FIGS. 11 and 12 graphically illustrate quantum efficiency for blue and white LEDs, respectively, according to various embodiments of the present invention, under the same operating parameters as FIGS. 9 and 10, respectively.
Figure 12:
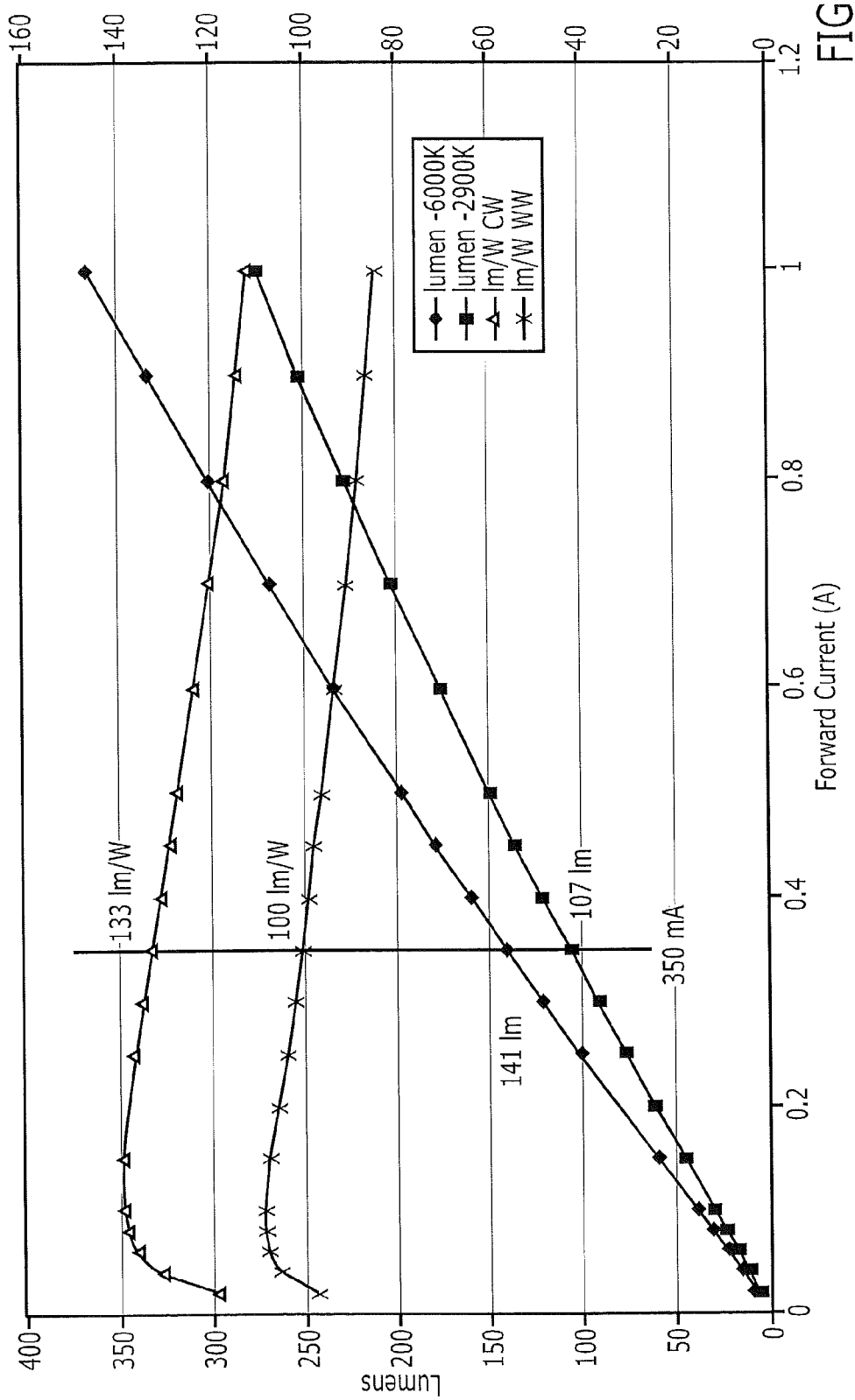

In sharp contrast, FIGS. 11 and 12 graphically illustrate similar data for a four-times as large LED 200, according to various embodiments of the present invention. In particular, FIG. 11 illustrates similar data for a blue device operating at about 350 mA and about 630 mW due to the larger die size, and shows an EQE of about 66% compared to 58.5% for the same radiant flux as FIG. 9. FIG. 12 illustrates increased EQE, i.e., 133 lm/W or 100 lm/W compared to 104 lm/W or 81 lm/W under similar operating parameters as FIG. 10. Note that FIG. 12 also shows a warm white light output of at least about 100 lumens, i.e., 107 lumens. Cool white output of at least about 130 lumens, i.e., 141lumens, is also shown.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
a semiconductor light emitting diode that comprises a single semiconductor die; and
at least eight cathode bond pads on the single semiconductor die.

2. A light emitting device according to claim 1 wherein the single semiconductor die is of at least about 4 mm$^2$ in area.

3. A light emitting device comprising:
a semiconductor light emitting diode that comprises a single semiconductor die; and
at least five bond pads on the single semiconductor die, wherein the single semiconductor die is of at least about 4 mm$^2$ in area, and
wherein the single semiconductor die includes four sides, each of which includes a midpoint and which define four corners, and wherein a bond pad is at each corner and also at, at least one midpoint of the single semiconductor die.

4. A light emitting device according to claim 3 wherein the single semiconductor die includes four sides, each of which includes a midpoint and which define four corners, and wherein a bond pad is at each corner and at each midpoint of the single semiconductor die.

5. A light emitting device comprising:
a semiconductor light emitting diode that comprises a single semiconductor die;
at least five bond pads on the single semiconductor die;
a wavelength conversion layer on the single semiconductor die; and
at least five bond pad extensions, a respective one of which is on a respective one of the bond pads and extends through the wavelength conversion layer.

6. A light emitting device comprising:
a semiconductor light emitting diode that comprises a single semiconductor die; and
at least five bond pads on the single semiconductor die;
wherein the single semiconductor die includes four sides, the light emitting device further comprising at least five spaced apart cathode contact lines on the single semiconductor die extending parallel to a first opposing pair of the four sides and at least five spaced apart cathode contact lines on the single semiconductor die extending parallel to a second opposing pair of the four sides, all of which are electrically connected to the bond pads.

7. A light emitting device comprising:
a semiconductor light emitting diode that comprises a single semiconductor die; and
at least five cathode bond pads on the single semiconductor die.

8. A light emitting device according to claim 3 further comprising a plurality of wire bond connections, a respective one of which is electrically connected to a respective one of the plurality of bond pads.

9. A light emitting device according to claim 4 further comprising a plurality of wire bond connections, a respective one of which is electrically connected to a respective one of the plurality of bond pads.

10. A light emitting device comprising:
a semiconductor light emitting diode that comprises a single semiconductor die of at least about 4 mm$^2$ in area that includes four sides, each of which includes a midpoint and which define four corners; and
a plurality of bond pads on the single semiconductor die, a respective one of which is at each corner and also at, at least one midpoint of the single semiconductor die.

11. A light emitting device according to claim 10 wherein a bond pad is at each corner and at each midpoint of the single semiconductor die.

12. A light emitting device according to claim 10 further comprising:
a wavelength conversion layer on the single semiconductor die; and
a plurality of bond pad extensions, a respective one of which is on a respective one of the bond pads and extends through the wavelength conversion layer.

13. A light emitting device according to claim 10 further comprising at least five spaced apart cathode contact lines on the single semiconductor die extending parallel to a first opposing pair of the four sides and at least five spaced apart cathode contact lines on the single semiconductor die extending parallel to a second opposing pair of the four sides, all of which are electrically connected to the bond pads.

14. A light emitting device according to claim 10 further comprising a plurality of wire bond connections that are electrically connected to a subset, less than all, of the plurality of bond pads.

15. A light emitting device according to claim 10 further comprising a plurality of wire bond connections, a respective one of which is electrically connected to a respective one of the plurality of bond pads.

16. A light emitting device according to claim 11 further comprising a plurality of wire bond connections, a respective one of which is electrically connected to a respective one of the plurality of bond pads.

17. A light emitting device comprising:
- a semiconductor light emitting diode that comprises a single semiconductor die of at least about 4 mm$^2$ in area;
- at least five bond pads on the single semiconductor die;
- a wavelength conversion layer on the single semiconductor die; and
- at least five bond pad extensions, a respective one of which is on a respective one of the bond pads and extends through the wavelength conversion layer.

18. A light emitting device according to claim 17 wherein the single semiconductor die includes four sides, each of which includes a midpoint and which define four corners, and wherein a bond pad and a bond pad extension are at each corner and also at, at least one midpoint of the single semiconductor die.

19. A light emitting device according to claim 17 wherein the single semiconductor die includes four sides, each of which includes a midpoint and which define four corners, and wherein a bond pad and a bond pad extension is at each corner and at each midpoint of the single semiconductor die.

20. A light emitting device according to claim 17 wherein the single semiconductor die includes four sides, the light emitting device further comprising at least five spaced apart cathode contact lines on the single semiconductor die extending parallel to a first opposing pair of the four sides and at least five spaced apart cathode contact lines on the single semiconductor die extending parallel to a second opposing pair of the four sides, all of which are electrically connected to the bond pads.

21. A light emitting device according to claim 17 further comprising a plurality of wire bond connections that are electrically connected to a subset, less than all, of the plurality of bond pad extensions.

22. A light emitting device according to claim 18 further comprising a plurality of wire bond connections, a respective one of which is electrically connected to a respective one of the plurality of bond pad extensions.

23. A light emitting device according to claim 19 further comprising a plurality of wire bond connections, a respective one of which is electrically connected to a respective one of the plurality of bond pad extensions.

* * * * *